SEMICONDUCTOR DEVICES AND METHODS OF MAKING SAME

Original Filed March 8, 1961

INVENTOR
Kenneth E. Statham

BY
Stevens, Davis, Miller & Mosher
ATTORNEYS

United States Patent Office 3,304,200

Patented Feb. 14, 1967

3,304,200

SEMICONDUCTOR DEVICES AND METHODS OF MAKING SAME

Kenneth E. Statham, Richardson, Tex., assignor to Texas Instruments Incorporated, Dallas, Tex., a corporation of Delaware Continuation of application Ser. No. 94,244, Mar. 8, 1961. This application Feb. 23, 1965, Ser. No. 440,340
6 Claims. (Cl. 117—201)

This is a continuation of patent application Serial No. 94,244, filed March 8, 1961, and now abandoned. This invention relates to semiconductor devices and methods of making same. More particularly it relates to devices having coatings of silicon oxide thereon and methods of making polycrystalline silicon oxide deposits.

Prior to this invention, semiconductors have been created with impurities under such conditions that the impurities diffuse into the semiconductor, modifying its electrical properties and enhancing its utility as a transistor, diode, resistor or the like. When treated with such an impurity, the impurity forms an atmosphere about the semiconductor body, the atoms of the impurity entering the entire surface of the semiconductor exposed to the impurity atmosphere. To obtain selective area diffusion it is necessary to mask areas of the semiconductor surface. Masking, however, at diffusion temperatures poses many and varied problems.

To effect a diffusion mask, it has been suggested that the surface of the semiconductor bodies be oxidized. In the case of germanium, the oxide coating was found to be a poor mask because most impurities readily diffuse through the germanium oxide. Further, it has been found that germanium oxide is partially soluble in water, this being an undesirable feature of a mask. On the contrary, a coating of polycrystalline silicon dioxide formed on a silicon semiconductor by oxidation at 1000° C. or above was found to have excellent properties as a diffusion mask. Only gallium penetrates a polycrystalline silicon dioxide coating.

After oxidizing the surface of a silicon semiconductor body to form a silicon dioxide coating, photographic techniques may be used to remove the silicon dioxide coating in desired areas to give the desired configuration on the semiconductor surface of areas where diffusion with an impurity is required by the design of the complete semiconductor component.

A silicon dioxide coating on a semiconductor wafer can serve another useful purpose other than as a mask. For example, during the process of diffusing, say gallium into germanium, the gallium will usually alloy with the surface of the germanium slice unless the surface is otherwise protected. If, however, a coating of silicon dioxide covers the germanium surface no alloying between the gallium and the germanium surface takes place. The gallium, not being masked by silicon dioxide, easily diffuses through the silicon dioxide coating. It is thus seen that a silicon dioxide coating can be useful in protecting the surface against alloying in addition to its usefulness as a mask against most semiconductor impurity diffusants.

Other useful purposes have been found for silicon dioxide coatings. For example, surface coatings of silicon dioxide on transistors or other semiconductor devices find utility in the passivation of the surface. Because of the normally "active" surface of semiconductor devices, a protective coating such as provided by the present invention is necessary to prevent surface current leakage, inversion regions and the like.

From the desirable properties of a silicon dioxide coating on semiconductors, a novel method of producing an impervious polycrystalline silicon dioxide coating on silicon, germanium, and other semiconductors has been discovered, and this discovery constitutes the basis for the present invention.

In the prior art, no suitable method of oxidizing silicon at temperatures below about 900° C. except in a pressurized bomb, was known. No method of producing effective silicon dioxide coatings on germanium was known. In this regard it is also known that temperatures above 700° C. cause undesired diffusions in germanium.

Throughout this application, the terms used to describe the semiconductor materials and transistors are employed in the sense as defined in the article by A. Coblenz and H. L. Owens in the issue of Electronics for August 1953.

Further details and advantages of this invention will be apparent from the attached drawing illustrative of the preferred embodiment thereof and from the following detailed description.

Figure 1:
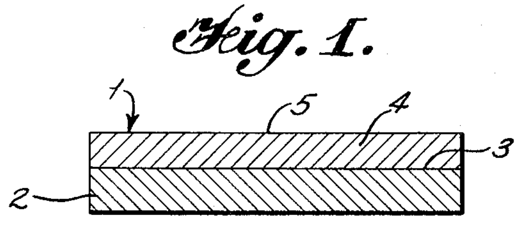
FIGURE 1 is a cross-section in elevation through a semiconductor wafer which has been subjected to a diffusion treatment using one impurity.

As illustrated in FIGURE 1, a semiconductor wafer, designated by the numeral 1, of one type conductivity has been treated in a diffusion process to create a diffused region 4 of opposite type conductivity extending to the surface 5. A PN junction 3 is defined between diffused region 4 and the undiffused region 2 of wafer 1.

Figure 2:
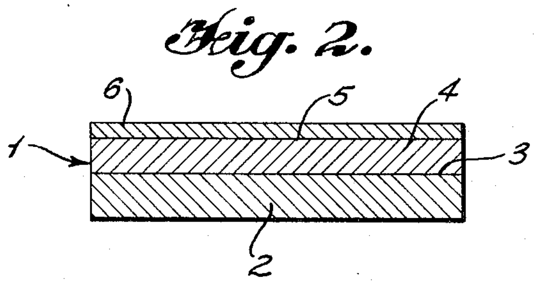
FIGURE 2 is a similar cross-section of a semiconductor to which a $SiO_2$ coating has been applied by the process of this invention.

FIGURE 2 illustrates the same semiconductor wafer 1 to which a coating of crystalline silicon dioxide 6 has been applied by the process of this invention.

Figure 3:
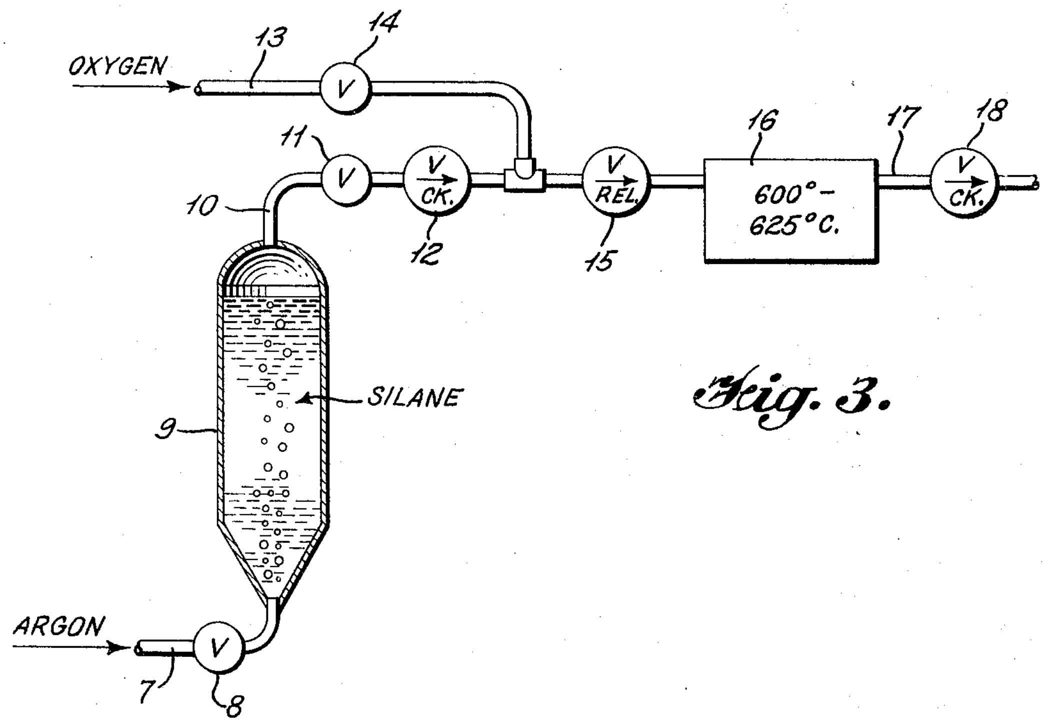
FIGURE 3 is a schematic diagram of the equipment used to carry out the process.

FIGURE 3 illustrates one form of the equipment which may be used to carry out the process, in which numeral 7 designates a line from a source of argon; 8 represents a control valve; 9 a vaporizer containing a silane through which argon is bubbled; 10 a line carrying the mixture of argon and silane; 11 a valve to control and regulate the flow; 12 a non-return valve; 13 a line from a source of high purity commercial oxygen; 14 a control valve; 15 a relief valve; 16 a chamber to receive semiconductor slices therein which can be closed to be gas tight except for the exhaust line 17, and heated to maintain the temperature of the semiconductor at about 600° C.; and 18 a non-return valve.

In commercial operations the exhaust may be treated to recover and purify silane, argon and oxygen which may be recycled either separately or as a mixture.

By way of illustration, the following examples are given of the application of the process to semiconductors.

*Example 1*

A silicon wafer with an impurity diffused into one surface is to be treated to diffuse a second impurity into the surface.

The silicon wafer was placed in a chamber where it was maintained at a temperature between 600° C. and 620° C. Argon gas was bubbled through a gas washing bottle, at a flow rate of about 2 liters per minute, containing ethyltriethoxysilane at 26° C. The argon gas carrying ethyltriethoxysilane was passed over the wafer. Simultaneously, oxygen was passed into the entry side of the chamber at the rate of one cubic foot in three hours. After three hours a coating of silicon dioxide of approximately 2000 angstrom units in thickness, with a variation of ±500 units, was deposited.

An oxygen gas stream was used in the above process to complete the formation of polycrystalline silicon dioxide. Although it was later recognized that oxygen was unnecessary for forming silicon dioxide, it was found that addition of oxygen produced uniform impervious coating of polycrystalline silicon dioxide of extremely high quality. It was further found that the use of oxygen aids in the completion of the coating operation thus forming a better quality of silicon oxide faster and at lower temperatures than can be produced without the additional oxygen.

*Example 2*

A germanium wafer which had been diffused with an impurity was placed in a chamber as in Example 1, but the argon and the silane were passed through the chamber without oxygen and at ordinary room temperature to sweep the air out of the apparatus. The argon flow rate was about 1 to 2 liters per minute. Then the wafer was heated to 600° C. until an initial coating of silicon dioxide was deposited on the wafer. This coating must have a minimum thickness of at least 300–400 angstrom units, but because of the possibilities of irregularities in the thickness of the silicon dioxide coating, a thickness of 800–2000 angstrom units is preferred. After this first layer of silicon dioxide was formed, oxygen was introduced into the chamber at a flow rate of about 1 cu. ft. per hour, along with the silane and the process continued until a coating of the desired thickness of silicon dioxide was obtained.

Oxygen gas is not used initially in coating germanium because an oxide of germanium will form at temperatures of 450° C. and above. Germanium oxide is not desired since it performs no useful function and is contaminating. The silanes used contain sufficient oxygen so that a thin polycrystalline silicon dioxide coating can be formed at the temperatures employed. However, after an initial silicon oxide film which is sufficient to protect the germanium surface from oxidation has been formed, additional oxygen can be introduced to complete the formation of silicon oxide thus producing the high quality silicon dioxide coatings characteristic of the invention. If it is not necessary to protect the germanium surface from oxidation, oxygen may be used initially and throughout the entire coating process to utilize the full advantages of the invention.

The silanes employed in this process may be any of the organic oxy compounds of silicon, such as, ethylorthosilicate, ethyltrimethoxysilane, tetramethoxysilane, triethoxyethylsilane, triethoxymethylsilane, or ethoxytriethylsilane, which are volatile under the conditions of the process. The process has utility for coating other surfaces besides semiconductors. Thus, any solid metal, non-metal, or metalloid surface may be coated by this process if the material is a solid at temperatures above about 600° C. Thus, silicon dioxide coatings may be deposited on such diverse materials as stainless steel, graphite, molded carbon bodies, and glass. In the case of metals subject to oxidation, and various forms of carbon, a silicon dioxide coating may be used to protect the underlying material from oxidation.

Although argon has been employed as the carrier gas, the other inert gases, such as helium, neon, zenon, and krypton, may be used. Likewise, even though specific flow rates of the gaseous material were used, almost any rate could be used which would allow decomposition of the silane to occur. Notwithstanding the preferred reaction temperature of about 600° C. to about 620° C., silicon dioxide would be deposited on a substrate from as low as about 575° C. to as high as about 950° C.

The temperatures and materials given have been disclosed for purposes of illustration and should not be construed as placing undue limitations upon the invention as many variations will be obvious without departing from the principles of this invention.

What is claimed is:

1. The method of making a semiconductor device including the steps of placing a semiconductor substrate in a reaction zone, introducing a vaporous mixture of oxygen and an organic oxy compound of silicon into said reaction zone, heating said reaction zone to an elevated temperature less than about 950° C., and maintaining said temperature for a period of time sufficient to deposit silicon dioxide on the surface of said semiconductor substrate.

2. In the method of making a semiconductor device, the steps of heating a semiconductor substrate to a temperature below its melting point and passing a vaporous mixture including an inert gas, oxygen, and an organic oxy compound of silicon over said substrate.

3. The method of making a polycrystalline silicon dioxide deposit on a semiconductor wafer comprising the steps of heating said wafer to an elevated temperature less than about 620° C. in the presence of a vaporous mixture of oxygen, inert gas and an organic oxy compound of silicon.

4. The method of making a semiconductor device including the steps of heating a semiconductor wafer to a temperature less than about 620° C. and passing a vaporous mixture including oxygen, inert gas, and triethoxyethylsilane thereover.

5. In the process of making semiconductor devices, the step of heating a semiconductor body to a temperature less than about 950° C. in the presence of a vaporous mixture of oxygen and an organic oxy compound of silicon.

6. The method of making a semiconductor device including the steps of heating a semiconductor wafer to a temperature less than about 620° C. and passing a vaporous mixture including oxygen, inert gas, and ethylorthosilicate thereover.

References Cited by the Examiner

UNITED STATES PATENTS 3,089,793 3/1963 Jordan et al. -------- 117—106

ALFRED L. LEAVITT, *Primary Examiner.*

JOSEPH B. SPENCER, *Examiner.*

W. L. JARVIS, *Assistant Examiner.*